US012660366B2

(12) United States Patent
Morea et al.

(10) Patent No.: US 12,660,366 B2
(45) Date of Patent: Jun. 16, 2026

(54) ELECTROMAGNETIC RADIATION DETECTOR WITH IMPROVED PERFORMANCE

(71) Applicant: Apple Inc., Cupertino, CA (US)

(72) Inventors: Matthew T. Morea, Cupertino, CA (US); Daniel Mahgerefteh, Campbell, CA (US); Romain F. Chevallier, Santa Clara, CA (US)

(73) Assignee: Apple Inc., Cupertino, CA (US)

( * ) Notice: Subject to any disclaimer, the term of this patent is extended or adjusted under 35 U.S.C. 154(b) by 411 days.

(21) Appl. No.: 18/197,543

(22) Filed: May 15, 2023

(65) Prior Publication Data

US 2024/0047591 A1     Feb. 8, 2024

Related U.S. Application Data

(60) Provisional application No. 63/396,114, filed on Aug. 8, 2022.

(51) Int. Cl.
| | |
|---|---|
| *H10F 77/124* | (2025.01) |
| *H10F 30/222* | (2025.01) |
| *H10F 71/00* | (2025.01) |
| *H10F 77/20* | (2025.01) |

(52) U.S. Cl.
CPC ....... *H10F 77/1248* (2025.01); *H10F 30/222* (2025.01); *H10F 71/1272* (2025.01); *H10F 77/206* (2025.01)

(58) Field of Classification Search
CPC .............. H10F 77/1248; H10F 77/206; H10F 71/1272; H10F 30/222; H10F 30/223; H10F 30/2215
See application file for complete search history.

(56) References Cited

U.S. PATENT DOCUMENTS

| | | | | |
|---|---|---|---|---|
| 4,794,439 | A | * | 12/1988 | Webb .................... H10F 30/223 |
| | | | | 257/632 |
| 4,984,032 | A | | 1/1991 | Miura et al. |
| 4,999,696 | A | | 3/1991 | Gentner et al. |
| 5,412,229 | A | * | 5/1995 | Kuhara ................ G02B 6/4207 |
| | | | | 257/431 |
| 5,483,261 | A | | 1/1996 | Yasutake |
| 5,488,204 | A | | 1/1996 | Mead et al. |
| 5,825,352 | A | | 10/1998 | Bisset et al. |
| 5,835,079 | A | | 11/1998 | Shieh |

(Continued)

FOREIGN PATENT DOCUMENTS

| | | |
|---|---|---|
| EP | 2918983 | 9/2015 |
| JP | 2000163031 | 6/2000 |

(Continued)

OTHER PUBLICATIONS

U.S. Appl. No. 18/197,521, filed May 15, 2023, Morea et al.

(Continued)

*Primary Examiner* — Sitaramarao S Yechuri

(74) *Attorney, Agent, or Firm* — Brownstein Hyatt Farber Shreck, LLP

(57) ABSTRACT

An electromagnetic radiation detector includes a PN junction between two group III-V semiconductor materials. The PN junction is defined by in-situ doping of the layers to improve the quality of the junction and the performance of the electromagnetic radiation detector.

20 Claims, 11 Drawing Sheets

(56) References Cited

U.S. PATENT DOCUMENTS

| | | | |
|---|---|---|---|
| 5,880,411 | A | 3/1999 | Gillespie et al. |
| 6,188,391 | B1 | 2/2001 | Seely et al. |
| 6,198,099 | B1 | 3/2001 | Kim |
| 6,310,610 | B1 | 10/2001 | Beaton et al. |
| 6,320,189 | B1 | 11/2001 | Ouvrier-Buffet |
| 6,410,917 | B1 | 6/2002 | Choi |
| 6,667,479 | B2 | 12/2003 | Ray |
| 6,690,014 | B1 | 2/2004 | Gooch |
| 6,690,387 | B2 | 2/2004 | Zimmerman et al. |
| 7,015,894 | B2 | 3/2006 | Morohoshi |
| 7,184,064 | B2 | 2/2007 | Zimmerman et al. |
| 7,227,145 | B2 | 6/2007 | Brouns |
| 7,268,349 | B2 | 9/2007 | Moon et al. |
| 7,405,403 | B2 | 7/2008 | Vilain |
| 7,450,246 | B2 | 11/2008 | Boesser et al. |
| 7,655,909 | B2 | 2/2010 | Schimert et al. |
| 7,663,607 | B2 | 2/2010 | Hotelling et al. |
| 7,825,379 | B2 | 11/2010 | Nakaki |
| 8,039,798 | B2 | 10/2011 | Oda |
| 8,441,094 | B2 | 5/2013 | Brueckl et al. |
| 8,513,605 | B2 | 8/2013 | Beratan |
| 8,530,933 | B2 | 9/2013 | Ogura |
| 8,610,070 | B2 | 12/2013 | Schimert et al. |
| 9,076,906 | B2 | 7/2015 | Ogura et al. |
| 9,163,998 | B2 | 10/2015 | Nam et al. |
| 9,243,959 | B2 | 1/2016 | Roh et al. |
| 9,411,055 | B2 | 8/2016 | Yoon et al. |
| 9,417,134 | B2 | 8/2016 | Koechlin et al. |
| 9,939,322 | B2 | 4/2018 | Kangas et al. |
| 10,323,987 | B2 | 6/2019 | Kangas et al. |
| 10,670,466 | B2 | 6/2020 | Kangas et al. |
| 10,900,841 | B2 | 1/2021 | Weiler et al. |
| 2006/0081768 | A1* | 4/2006 | Dutta ................... H10F 39/809 |
| | | | 257/458 |
| 2015/0362374 | A1 | 12/2015 | Wheeler et al. |
| 2020/0194486 | A1 | 6/2020 | Na |
| 2023/0420595 | A1* | 12/2023 | Taguchi ............. H10F 77/1243 |
| 2024/0047602 | A1 | 2/2024 | Morea et al. |

FOREIGN PATENT DOCUMENTS

| | | | |
|---|---|---|---|
| JP | 2002342033 | 11/2002 | |
| JP | 2012099806 A * | 5/2012 | .......... H10F 77/219 |
| JP | 2013047658 | 3/2013 | |
| JP | 2013530386 | 7/2013 | |
| KR | 20060092879 | 8/2006 | |
| KR | 100658114 | 12/2006 | |
| KR | 20140075462 | 6/2014 | |
| WO | WO 10/094051 | 8/2010 | |
| WO | WO 16/112355 | 7/2016 | |

OTHER PUBLICATIONS

Jones et al., "A Polarization Sensitive Bolometric Receiver for Observations of the Cosmic Microwave Background," SPIE, 4855-227-238, 2003.

* cited by examiner

300

PROVIDE ANODE LAYER ~302

PROVIDE ELECTOMAGNETIC RADIATION ABSORBER LAYER ~304

PROVIDE CATHODE LAYER ~306

PROVIDE DOPED REGION(S) IN CATHODE LAYER VIA EX-SITU DOPING PROCESS ~308

PROVIDE CONTACT(S) ~310

ELECTROMAGNETIC RADIATION DETECTOR WITH IMPROVED PERFORMANCE

CROSS-REFERENCE TO RELATED APPLICATION

This application is a nonprovisional and claims the benefit under 35 U.S.C. § 119(e) of U.S. Provisional Patent Application No. 63/396,114, filed Aug. 8, 2022, the contents of which are incorporated herein by reference as if fully described herein.

TECHNICAL FIELD

Embodiments described herein relate to electromagnetic radiation detectors, and in particular to PIN diodes configured for the detection of electromagnetic radiation.

BACKGROUND

Sensors are included in many of today's electronic devices, including electronic devices such as smartphones, computers (e.g., tablet computers or laptop computers), wearable electronic devices (e.g., electronic watches, smart watches, or health monitors), and so on. Sensors may variously sense the presence of objects, distances to objects, proximities of objects, movement of objects (e.g., whether objects are moving, or the speed, acceleration, or direction of movement of objects), compositions of objects, and so on. Electromagnetic radiation detectors (also referred to as electromagnetic radiation sensors, optical sensors, and optical detectors) are commonly used in sensors to detect light (e.g., visible and/or infrared light) collected or otherwise received by the sensor. Dark current that occurs in these electromagnetic radiation detectors can limit the signal-to-noise ratio (SNR) of measurements taken by the detector, and thus it would be desirable to provide electromagnetic radiation detectors with reduced dark current.

SUMMARY

Embodiments described herein relate to electromagnetic radiation detectors, and in particular to PIN diodes configured for the detection of electromagnetic radiation. In one embodiment, an electromagnetic radiation detector may include an electromagnetic radiation absorber layer, a cathode layer, and one or more doped regions in the cathode layer. The electromagnetic radiation absorber layer may comprise a first group III-V semiconductor material, and may have a first conductivity type. The cathode layer may be disposed on the electromagnetic radiation absorber layer. The cathode layer may comprise a second group III-V semiconductor material, and may have a second conductivity type that is opposite the first conductivity type. The cathode layer may form a PN junction with the electromagnetic radiation absorber layer. The PN junction may be defined by in-situ doping of the cathode layer and in-situ doping of the electromagnetic radiation absorber layer. The one or more doped regions in the cathode layer may have the first conductivity type, and may be defined by ex-situ doping of the cathode layer. The one or more doped regions in the cathode layer may define a boundary of the PN junction between the cathode layer and the electromagnetic radiation absorber layer. In one embodiment, the first conductivity type may be p-type and the second conductivity type may be n-type.

In one embodiment, the electromagnetic radiation detector further comprises an anode layer disposed on the surface of the electromagnetic radiation absorber layer opposite the cathode layer. The anode layer may comprise a third group III-V semiconductor material, and may have the first conductivity type.

In one embodiment, the electromagnetic radiation absorber layer and the cathode layer form a mesa structure on the anode layer. The mesa structure may define a first surface disposed on the anode layer, a second surface opposite the first surface, and a sidewall between the first surface and the second surface. The one or more doped regions in the cathode layer may be provided along the sidewall of the mesa structure.

In one embodiment, the electromagnetic radiation detector further comprises a cathode contact layer on a portion of the cathode layer not including the one or more doped regions. The cathode contact layer may have the second conductivity type. A cathode contact may be on the cathode contact layer.

In one embodiment, the anode layer may comprise a first surface, a second surface opposite the first surface, and a sidewall between the first surface and the second surface. The first surface of the mesa structure may be disposed on the second surface of the anode layer. An anode contact may be disposed on the second surface of the anode layer between the sidewall of the anode layer and the sidewall of the mesa structure.

In one embodiment, the first group III-V semiconductor material may comprise indium gallium arsenide (InGaAs), the second group III-V semiconductor material may comprise indium arsenide phosphide (InAsP), and the third group III-V semiconductor material may comprise indium phosphide (InP).

In one embodiment, a method for manufacturing an electromagnetic radiation detector may include providing an electromagnetic radiation absorber layer, providing a cathode layer, and providing one or more doped regions in the cathode layer. The electromagnetic radiation absorber layer may comprise a first group III-V semiconductor material and may have a first conductivity type that is defined by an in-situ doping process. The cathode layer may be provided on the electromagnetic radiation absorber layer. The cathode layer may comprise a second group III-V semiconductor material and may have a second conductivity type that is defined by an in-situ doping process. The second conductivity type may be opposite the first conductivity type. The cathode layer may form a PN junction with the electromagnetic radiation absorber layer. The PN junction may be defined by in-situ doping of the cathode layer and in-situ doping of the electromagnetic radiation absorber layer. The one or more doped regions may be provided via an ex-situ doping process. The one or more doped regions may have the first conductivity type, and may define a boundary of the PN junction between the cathode layer and the electromagnetic radiation absorber layer.

In one embodiment, the ex-situ doping process is a diffusion doping process. In another embodiment, the ex-situ doping process is an ion implantation process.

In one embodiment, the first conductivity type is p-type and the second conductivity type is n-type.

In one embodiment, the method further includes providing an anode layer. The anode layer may comprise a third group III-V semiconductor material and may have the first conductivity type. The electromagnetic radiation absorber layer may be provided on the anode layer such that the electromagnetic radiation absorber layer is between the anode layer and the cathode layer.

In one embodiment, the method further includes patterning the cathode layer and the electromagnetic radiation absorber layer to provide a mesa structure on the anode layer. The mesa structure may include a first surface disposed on the anode layer, a second surface opposite the first surface, and a sidewall between the first surface and the second surface. The one or more doped regions in the cathode layer may be provided along the sidewall of the mesa structure.

In one embodiment, the method further includes providing a cathode contact layer on a portion of the cathode layer not including the one or more doped regions. The cathode contact layer may have the second conductivity type. A cathode contact may be provided on the cathode contact layer.

In one embodiment, the anode layer may comprise a first surface, a second surface opposite the first surface, and a sidewall between the first surface and the second surface. The first surface of the mesa structure may be disposed on the second surface of the anode layer. The method may further include providing an anode contact on the second surface of the anode layer between the sidewall of the anode layer and the sidewall of the mesa structure.

In one embodiment, the first group III-V semiconductor material may comprise InGaAs, the second group III-V semiconductor material may be InAsP, and the third group III-V semiconductor material may be InP.

BRIEF DESCRIPTION OF THE DRAWINGS

Reference will now be made to representative embodiments illustrated in the accompanying figures. It should be understood that the following descriptions are not intended to limit this disclosure to one included embodiment. To the contrary, the disclosure provided herein is intended to cover alternatives, modifications, and equivalents as may be included within the spirit and scope of the described embodiments, and as defined by the appended claims.

The use of the same or similar reference numerals in different figures indicates similar, related, or identical items.

Figure 1:
FIG. 1 shows a cross-sectional view of an electromagnetic radiation detector, such as described herein.
Figure 1:
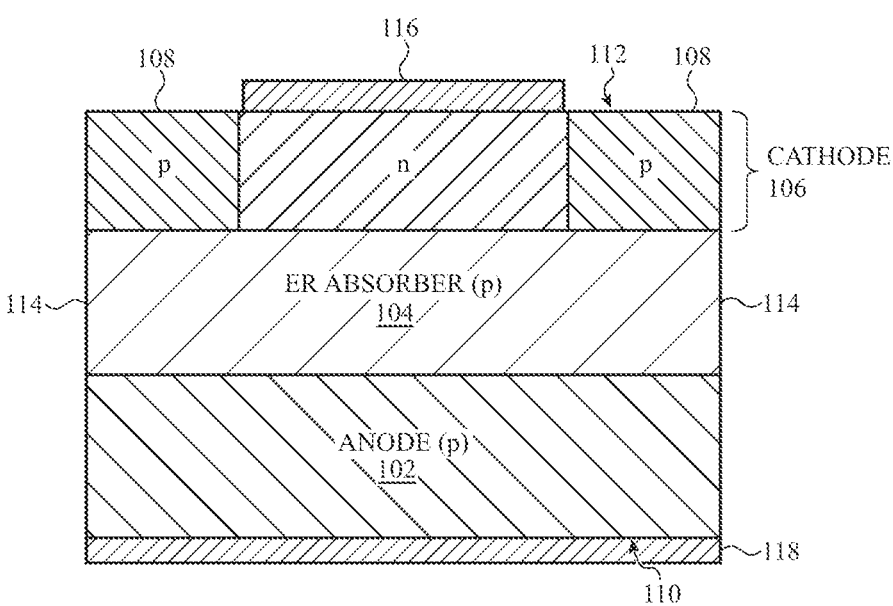

The use of cross-hatching or shading in the accompanying figures is generally provided to clarify the boundaries between adjacent elements and also to facilitate legibility of the figures. Accordingly, neither the presence nor the absence of cross-hatching or shading conveys or indicates any preference or requirement for particular materials, material properties, element proportions, element dimensions, commonalities of similarly illustrated elements, or any other characteristic, attribute, or property for any element illustrated in the accompanying figures.

Additionally, it should be understood that the proportions and dimensions (either relative or absolute) of the various features and elements (and collections and groupings thereof) and the boundaries, separations, and positional relationships presented therebetween, are provided in the accompanying figures merely to facilitate an understanding of the various embodiments described herein and, accordingly, may not necessarily be presented or illustrated to scale, and are not intended to indicate any preference or requirement for an illustrated embodiment to the exclusion of embodiments described with reference thereto.

DETAILED DESCRIPTION

Embodiments described herein relate to electromagnetic radiation detectors and methods for manufacturing electromagnetic radiation detectors. In particular, embodiments described herein relate to electromagnetic radiation detectors comprising a group III-V semiconductor material, which include a PN junction defined by in-situ doping rather than ex-situ doping (e.g., diffusion or ion implantation). Conventionally, PN junctions in electromagnetic radiation detectors comprising a group III-V semiconductor material have been defined by ex-situ doping such as diffusion doping. Defining a PN junction via in-situ doping may allow for much more abrupt transitions between conductivity types in the PN junction when compared to ex-situ doping, which may result in smaller depletion widths and lower dark current. As discussed herein, in-situ doping is doping that occurs during growth of a semiconductor layer or layers. This may include, for example, adding dopants during growth of a particular layer or layers. Further as discussed herein, ex-situ doping is doping that occurs after growth of a semiconductor layer or layers. Ex-situ doping is usually controlled by photolithography processes, and may include diffusion and ion implantation.

Some applications of electromagnetic radiation detectors may demand higher performance than others. For example, some applications may require an SNR above a target threshold. One source of noise in electromagnetic radiation detectors is dark current. Dark current refers to the current that flows through an electromagnetic radiation detector even when no radiation (e.g., photons) are entering the detector. Dark current may be caused by the random generation of electrons and holes in a depletion region of an electromagnetic radiation detector, and may be exacerbated by crystallographic defects within or near a depletion region of the device. The electromagnetic radiation detectors described herein, and the manufacturing processes to achieve them, are configured to reduce dark current and thus improve performance.

These foregoing and other embodiments are discussed below with reference to FIGS. 1-6. However, those skilled in the art will readily appreciate that the detailed description given herein with respect to these figures is for explanation only and should not be construed as limiting.

FIG. 1 shows a cross-sectional view of an electromagnetic radiation detector 100 according to one embodiment of the present disclosure. The electromagnetic radiation detector 100 may include an anode layer 102, an electromagnetic radiation absorber layer 104 on the anode layer 102, and a cathode layer 106 on the electromagnetic radiation absorber layer 104. The cathode layer 106 may include one or more doped regions 108. Specifically, the electromagnetic radiation detector 100 may define a first surface 110, a second surface 112 opposite the first surface 110, and a sidewall 114 between the first surface 110 and the second surface 112. The one or more doped regions 108 may be provided along the sidewall 114 and may be doped such that a conductivity type thereof is inverted, leaving an interior portion of the cathode layer 106 having an opposite conductivity type to the one or more doped regions 108. The interior portion of the cathode layer 106 may form a PN junction with the electromagnetic radiation absorber layer 104. Accordingly, the one or more doped regions 108 may define the boundaries of the PN junction between the cathode layer 106 and the electromagnetic radiation absorber layer 104.

To provide the one or more doped regions 108, the cathode layer 106 may be grown and doped via an in-situ process, and the one or more doped regions 108 may be provided by an ex-situ doping process (e.g., diffusion or ion implantation). The electromagnetic radiation absorber layer 104 may similarly be grown and doped by an in-situ process. Accordingly, the PN junction between the electromagnetic radiation absorber layer 104 and the cathode layer 106 may be defined by an in-situ doping process. Those skilled in the art will appreciate that in-situ doping allows for sharp transitions in conductivity type (i.e., n-type and p-type). Accordingly, by defining the conductivity type of the portion of the cathode layer 106 forming the PN junction with the electromagnetic radiation absorber layer 104 (and the conductivity type of the entirety of the electromagnetic radiation absorber layer 104) via an in-situ doping process, a sharp transition is achieved between conductivity types for the PN junction. In contrast to an ex-situ doping process in which a transition between conductivity types for a PN junction occurs over a gradient, in-situ doping effectively creates a demarcated discontinuity between conductivity types. This may reduce a width of a depletion region formed in the PN junction during operation of the electromagnetic radiation detector 100, and may in turn reduce dark current in the device.

Conventionally, the PN junction of an electromagnetic radiation detector would be defined by ex-situ doping such as diffusion or ion implantation. That is, a conventional approach would define the interior portion of the cathode layer 106 via ex-situ doping, leaving the area where the one or more doped regions 108 are located undoped or doped via an in-situ process (the opposite of what is described herein). This leaves a gradual transition in conductivity type defining the PN junction, which may suffer from increased dark current and decreased performance compared to the embodiments described herein.

The anode layer 102, the electromagnetic radiation absorber layer 104, and the one or more doped regions 108 may have a first conductivity type, while the cathode layer 106 may have a second conductivity type opposite the first conductivity type. FIG. 1 shows the first conductivity type as p-type and the second conductivity type as n-type. However, those skilled in the art will appreciate that the principles of the present disclosure may also apply to a device having inverted conductivity types to those shown in FIG. 1. In some embodiments, the anode layer 102, the electromagnetic radiation absorber layer 104, and the cathode layer 106 may comprise the same or different group III-V semiconductor materials. For example, the anode layer 102 may comprise InP, the electromagnetic radiation absorber layer 104 may comprise InGaAs, and the cathode layer 106 may comprise InAsP. Those skilled in the art will appreciate that for group III-V semiconductor materials, it is currently difficult to invert a conductivity type from p-type to n-type in an ex-situ doping process (e.g., due to a lack of suitable dopants). This is why conventional electromagnetic radiation detectors comprising group III-V semiconductor materials have inverted conductivity types to the ones shown in FIG. 1, because it would not be possible to provide an electromagnetic radiation detector including a PN junction defined by diffusion with the conductivity types as shown. By using in-situ doping to define the PN junction between the cathode layer 106 and the electromagnetic radiation absorber layer 104, the principles of the present disclosure allow for electromagnetic radiation detectors having opposite conductivity types to conventional detectors, which may be advantageous for integration purposes in some circumstances. While these same considerations may make it difficult to invert the conductivity types of the electromagnetic radiation detector 100 shown in FIG. 1, the principles of the present disclosure would nonetheless apply should it be possible to invert the conductivity of the cathode layer 106 from p-type to n-type.

A cathode contact 116 may be provided on a portion of the cathode layer 106 opposite the electromagnetic radiation absorber layer 104 where the one or more doped regions 108 are not provided (i.e., so that it does not directly contact the one or more doped regions 108). An anode contact 118 may be provided on the anode layer 102 opposite the electromagnetic radiation absorber layer 104.

In operation, a biasing signal (e.g., a biasing voltage and/or biasing current) may be applied between the cathode contact 116 and the anode contact 118. As electromagnetic radiation (e.g., photons) enters the electromagnetic radiation absorber layer 104, it causes the generation of electron/hole pairs in a depletion region caused by the PN junction between the electromagnetic radiation absorber layer 104 and the cathode layer 106. This in turn causes a current to flow in the electromagnetic radiation absorber layer 104, which may be proportional to an amount of electromagnetic radiation entering the electromagnetic radiation absorber layer 104. Accordingly, the electromagnetic radiation detector 100 allows for the detection of electromagnetic radiation. As previously discussed, the sharp transition in the PN junction between the electromagnetic radiation absorber layer 104 and the cathode layer 106 may result in reduced width of a depletion region formed therein, which may in turn decrease dark current or otherwise improve the performance of the electromagnetic radiation detector 100.

In some embodiments, the electromagnetic radiation detector 100 may include additional layers. For example, in some embodiments the anode layer 102 may be provided on a substrate and a buffer layer, which matches a lattice constant of the substrate to a lattice constant of the anode layer 102. Further, there may be one or more intervening layers between the anode layer 102 and the electromagnetic radiation absorber layer 104 and/or between the electromagnetic radiation absorber layer 104 and the cathode layer 106.

Figure 2:
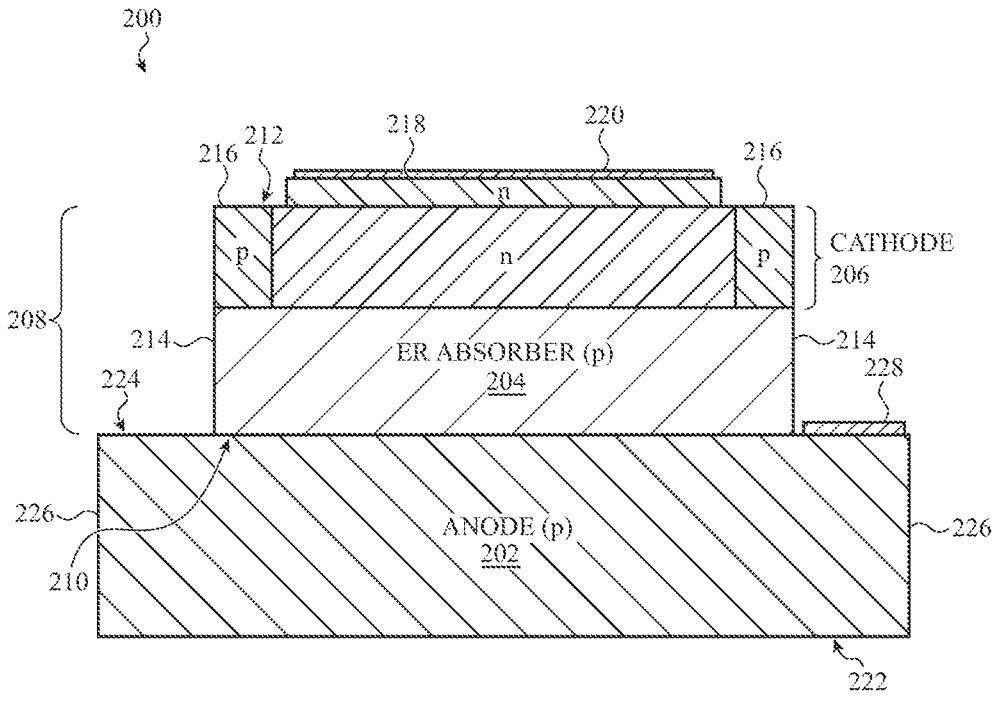
FIG. 2 shows a cross-sectional view of an electromagnetic radiation detector, such as described herein.

FIG. 2 shows an electromagnetic radiation detector 200 according to an additional embodiment of the present disclosure. The electromagnetic radiation detector 200 shown in FIG. 2 is similar to that shown in FIG. 1 and includes an anode layer 202, an electromagnetic radiation (ER) absorber layer 204 on the anode layer 202, and a cathode layer 206 on the electromagnetic radiation absorber layer 204. The electromagnetic radiation absorber layer 204, the cathode layer 106, and, in some circumstances, a portion of the anode layer 202 form a mesa structure 208 having a first surface 210 disposed on the anode layer 202, a second surface 212 opposite the first surface 210, and a sidewall 214 between the first surface 210 and the second surface 212. The cathode layer 206 may include one or more doped regions 216. The one or more doped regions 216 may be provided along the sidewall 214 of the mesa structure 208 and may be doped such that a conductivity type thereof is inverted, leaving an interior portion of the cathode layer 206 having an opposite conductivity type to the one or more doped regions 216. The interior portion of the cathode layer 206 may form a PN junction with the electromagnetic radiation absorber layer 204. Accordingly, the one or more doped regions 216 may define the boundaries of the PN junction between the cathode layer 206 and the electromagnetic radiation absorber layer 204.

To provide the one or more doped regions 216, the cathode layer 206 may be grown and doped via an in-situ process, and the one or more doped regions 216 may be provided by an ex-situ doping process (e.g., diffusion or ion implantation). The electromagnetic radiation absorber layer 204 may similarly be grown and doped by an in-situ process. Accordingly, the PN junction between the electromagnetic radiation absorber layer 204 and the cathode layer 206 may be defined by an in-situ doping process. Those skilled in the art will appreciate that in-situ doping allows for sharp transitions in conductivity type (i.e., n-type and p-type). Accordingly, by defining the conductivity type of the portion of the cathode layer 206 forming the PN junction with the electromagnetic radiation absorber layer 204 (and the conductivity type of the entirety of the electromagnetic radiation absorber layer 204) via an in-situ doping process, a sharp transition is achieved between the conductivity types for the PN junction. This may reduce a width of a depletion region formed in the PN junction during operation of the electromagnetic radiation detector 200, and may in turn reduce dark current in the device, as previously discussed with respect to FIG. 1.

The anode layer 202, the electromagnetic radiation absorber layer 204, and the one or more doped regions 216 may have a first conductivity type, while the cathode layer 206 may have a second conductivity type opposite the first conductivity type. FIG. 2 shows the first conductivity type as p-type and the second conductivity type as n-type. However, those skilled in the art will appreciate that the principles of the present disclosure may also apply to a device having inverted conductivity types to those shown in FIG. 2. In some embodiments, the anode layer 202, the electromagnetic radiation absorber layer 204, and the cathode layer 206 may comprise the same or different group III-V semiconductor materials. For example, the anode layer 202 may comprise InP, the electromagnetic radiation absorber layer 204 may comprise InGaAs, and the cathode layer 206 may comprise InAsP. As previously discussed, the principles of the present disclosure enable an electromagnetic radiation detector having opposite conductivity types to those conventionally used. This may be advantageous for integration purposes in some circumstances. However, the principles of the present disclosure may apply to devices having the opposite conductivity types to those shown in FIG. 2.

A cathode contact layer 218, which may have the second conductivity type at a higher concentration than the cathode layer 206, may be provided over a portion of the cathode layer 206 opposite the electromagnetic radiation absorber layer 204 not including the one or more doped regions 216 (i.e., so that it does not directly contact the one or more doped regions 216). A cathode contact 220 may be provided on the cathode contact layer 218 opposite the cathode layer 206. The anode layer 202 may define a first surface 222, a second surface 224 opposite the first surface 222, and a sidewall 226 between the first surface 222 and the second surface 224. The first surface 210 of the mesa structure 208 may be disposed on the second surface 224 of the anode layer 202. An anode contact 228 may be provided on the second surface 224 of the anode layer 202 between the sidewall 226 of the anode layer 202 and the sidewall 214 of the mesa structure 208.

The electromagnetic radiation detector 200 may operate in the same manner as discussed above with respect to FIG. 1. As previously discussed, the sharp transition in the PN junction between the electromagnetic radiation absorber layer 204 and the cathode layer 206 may result in reduced width of a depletion region formed therein, which may in turn decrease dark current or otherwise improve performance of the electromagnetic radiation detector 200.

Figure 3:
FIG. 3 is a flowchart depicting example operations of a method for manufacturing an electromagnetic radiation detector, such as described herein.
Figure 3:
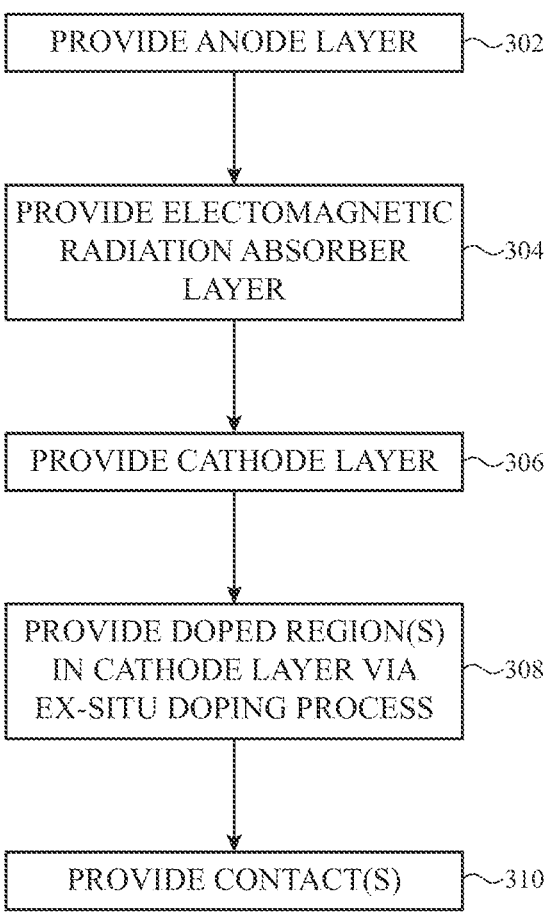

FIG. 3 is a flowchart illustrating a method 300 for manufacturing an electromagnetic radiation detector according to one embodiment of the present disclosure. For purposes of illustration, the method 300 describes the general steps to manufacture the electromagnetic radiation detector 100 shown in FIG. 1. FIGS. 4A through 4E illustrate each of the steps of the method 300. The anode layer 102 is provided (step 302 and FIG. 4A), the electromagnetic radiation absorber layer 104 is provided on the anode layer 102 (step 304 and FIG. 4B), and the cathode layer 106 is provided on the electromagnetic radiation absorber layer 104 (step 306 and FIG. 4C). The anode layer 102, the electromagnetic radiation absorber layer 104, and the cathode layer 106 may be provided by any suitable process. However, at least the electromagnetic radiation absorber layer 104 and the cathode layer 106 are provided via a growth process including in-situ doping, such that a junction between the electromagnetic radiation absorber layer 104 and the cathode layer 106 is defined by in-situ doping. The anode layer 102 and the electromagnetic radiation absorber layer 104 are provided having a first doping type, while the cathode layer 106 is provided having a second doping type opposite the first doping type. Because of the in-situ doping process used to provide the electromagnetic radiation absorber layer 104 and the cathode layer 106, a sharp transition in conductivity type occurs between these layers.

Figure 4A:
FIGS. 4A through 4E illustrate the steps of the method described in FIG. 3.
Figure 4A:
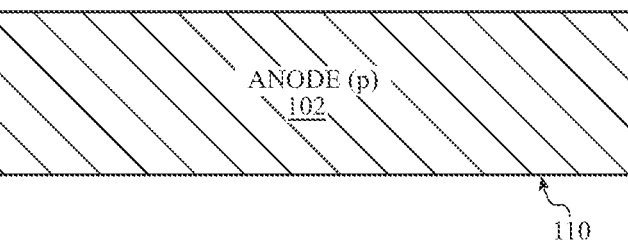
Figure 4B:
Figure 4B:
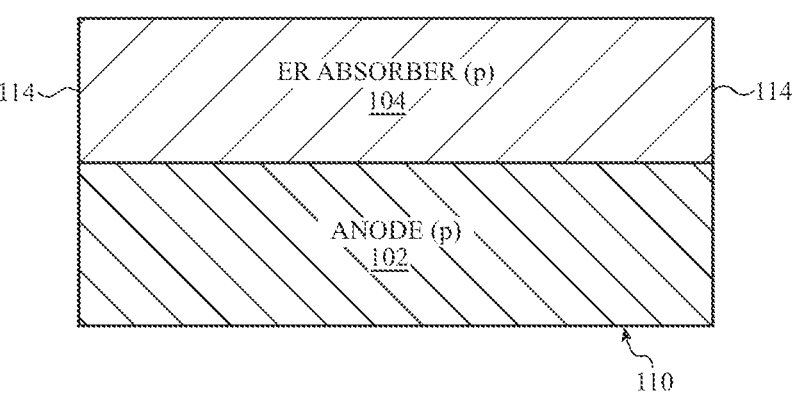
Figure 4C:
Figure 4C:
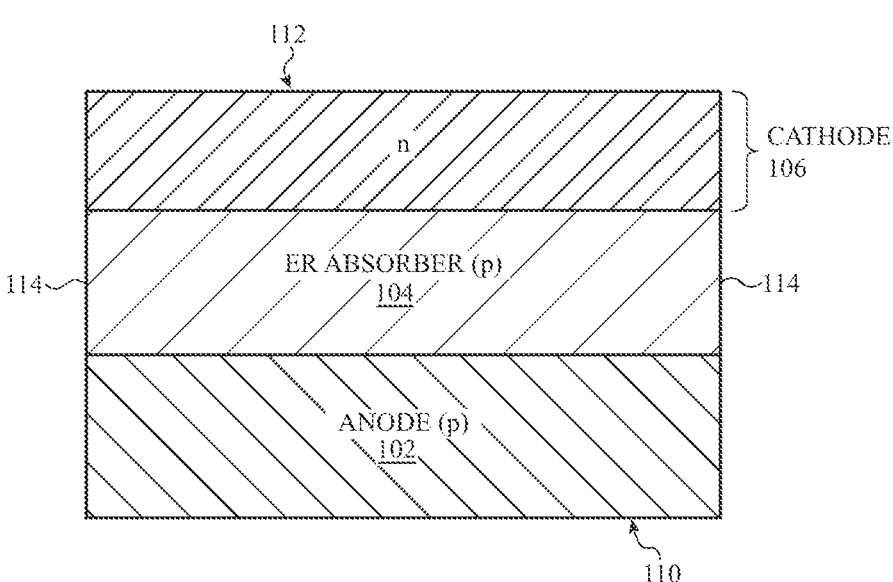
Figure 4D:
Figure 4D:
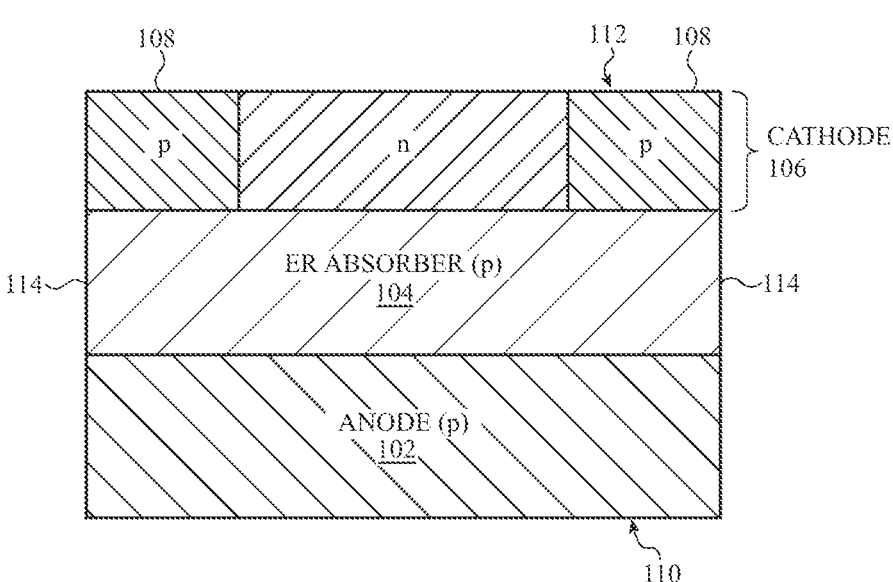
Figure 4E:
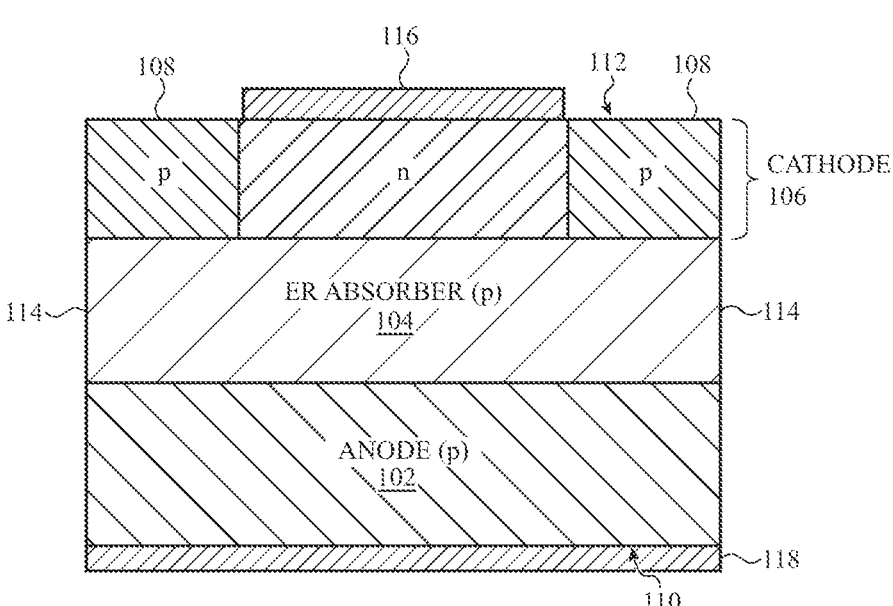

The one or more doped regions 108 are provided via an ex-situ doping process (step 308 and FIG. 4D). The ex-situ doping process may include any suitable ex-situ doping process such as diffusion or ion implantation. In some embodiments, providing the one or more doped regions 108 may include multiple steps such as providing a patterned mask on a surface of the cathode layer 106, introducing a dopant into the one or more doped regions 108 in the cathode layer 106 via one or more openings in the patterned mask, and subsequently removing the patterned mask. As previously discussed, the one or more doped regions 108 may be provided along the sidewall 114 of the electromagnetic radiation detector 100, and may define the boundaries of the PN junction formed between the electromagnetic radiation absorber layer 104 and the cathode layer 106. By defining the conductivity type of the portion of the cathode layer 106 forming the PN junction with the electromagnetic radiation absorber layer 104 (and the conductivity type of the entirety of the electromagnetic radiation absorber layer 104) via an in-situ doping process, an abrupt transition in conductivity type is achieved, which may improve the performance of the device as previously discussed. The cathode contact 116 and the anode contact 118 may be provided (step 310 and FIG. 4E) via a suitable metallization process.

Figure 5A:
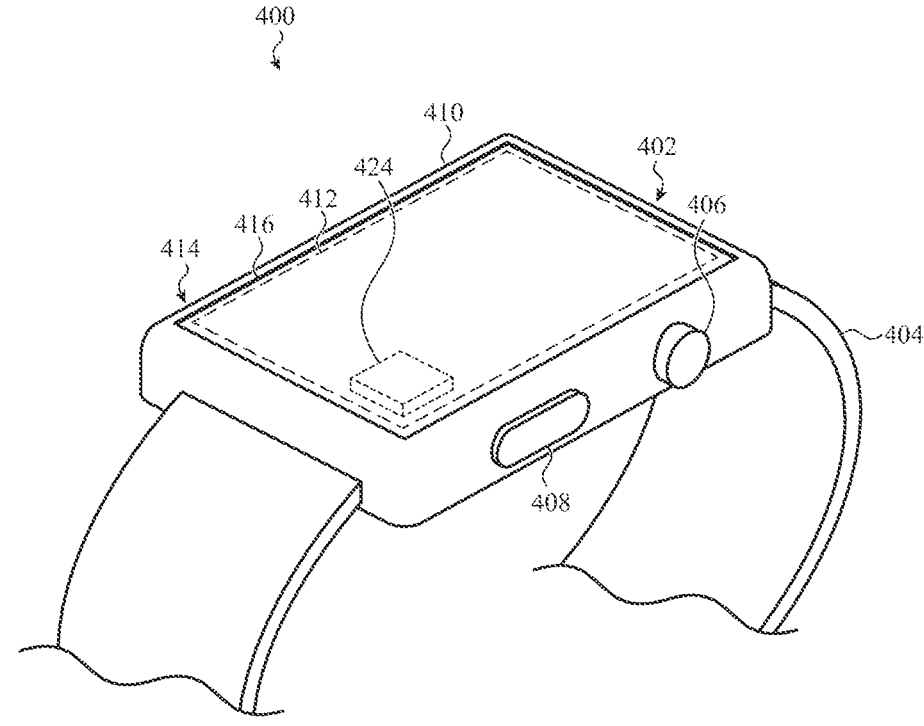
FIGS. 5A and 5B illustrate a front isometric view and a back isometric view, respectively, of a wearable device, such as described herein.
Figure 5B:
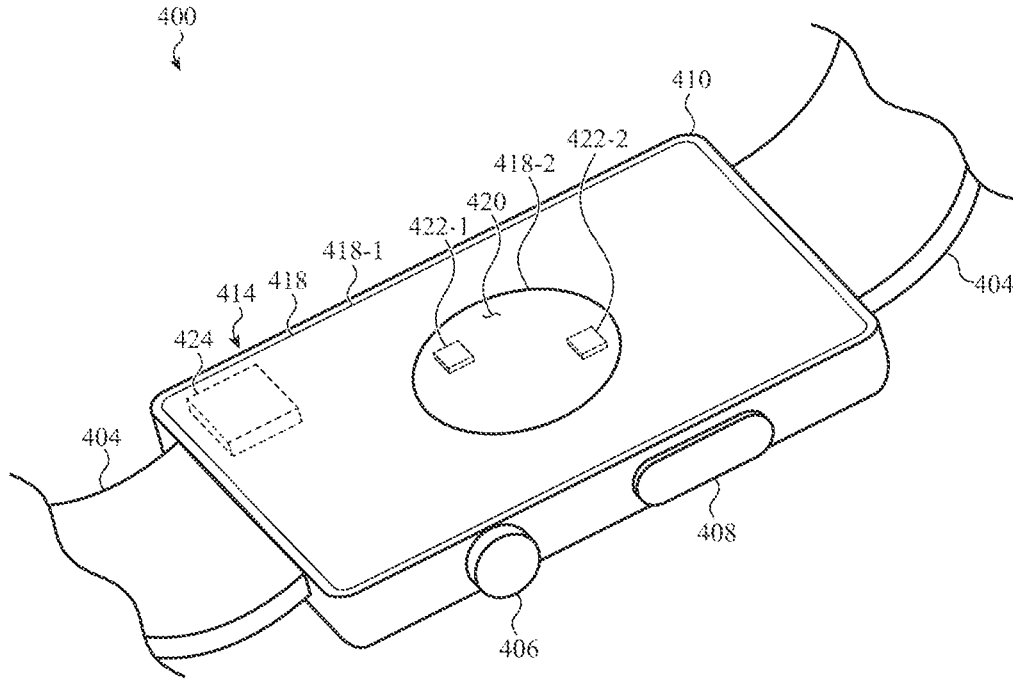

FIGS. 5A and 5B show an example of a wearable device 400 that may incorporate one or more sensors, including one or more electromagnetic radiation sensors as discussed herein. Specifically, FIG. 5A shows a front isometric view of the wearable device 400, while FIG. 5B shows a back isometric view of the wearable device 400. The sensors of the wearable device 400 may be used, for example, to acquire biometric data from a user (e.g., heart rate, respiration rate, blood pressure, blood flow rate, blood oxygenation), or to determine a status of the wearable device 400 (e.g., whether the wearable device is being worn, one or more ambient environmental conditions). While the wearable device 400 is shown having the form factor of a watch, the wearable device 400 could by any suitable type of wearable device having any form factor. Further, the principles of the present disclosure apply equally to non-wearable devices such as smartphones, tablets, laptop computers, desktop computers, and the like.

The wearable device 400 includes a body 402 (e.g., a watch body) and a band 404. The body 402 may include an input or selection device, such as a crown 406 or a button 408. The band 404 may be attached to a housing 410 of the body 402, and may be used to attach the body 402 to a body part of a user (e.g., an arm, wrist, leg, ankle, or waist). The housing 410 may at least partially surround a display 412. In some embodiments, the housing 410 may include a sidewall 414, which may support a front cover 416 (shown in FIG. 5A) and/or a back cover 418 (shown in FIG. 5B). The front cover 416 may be positioned over the display 502, and may provide a window through which the display 502 is viewed. In some embodiments, the display 412 may be attached to (or about) the sidewall 414 and/or the front cover 416. In other embodiments, the display 412 may not be included and/or the housing 410 may have an alternative configuration.

The display 412 may include one or more light emitting elements including, for example, light-emitting elements that define a light-emitting diode (LED) display, an organic LED (OLED) display, a liquid crystal display (LCD), an electroluminescent (EL) display, or any other type of display. In some embodiments, the display 412 may include, or be associated with, one or more touch and/or force sensors that are configured to detect touch and/or force applied to the front cover 416.

In some embodiments, the sidewall 414 of the housing 410 may be formed using one or more metals (e.g., aluminum or stainless steel), polymers (e.g., plastics), ceramics, or composites (e.g., carbon fiber). The front cover 416 may be formed, for example, using one or more of glass, a crystal (e.g., sapphire), or a transparent polymer (e.g., plastic) that enables a user to view the display 412 through the front cover 416. In some cases, a portion of the front cover 416 (e.g., a perimeter portion of the front cover 416) may be coated in an opaque ink to obscure components included within the housing 410. In some cases, all of the exterior components may be formed of a transparent material, and the components of the wearable device 400 may or may not be obscured by an opaque ink or opaque structure within the housing 410.

The back cover 418 may be formed using the same material or materials used to form the sidewall 414 and/or the front cover 416. In some cases, the back cover 418 may be part of a monolithic element that also forms the sidewall 414. In other cases, and as shown, the back cover 418 may be a multi-part back cover, such as a back cover having a first back cover portion 418-1 attached to the sidewall 414 and a second back cover portion 418-2 attached to the first back cover portion 418-1. The second back cover portion 418-2 may in some embodiments have a circular perimeter and an arcuate exterior surface 420 (i.e., an exterior surface 420 having an arcuate profile).

The front cover 416, the back cover 418, and the first back cover portion 418-1 may be mounted to the sidewall 414 using fasteners, adhesives, seals, gaskets, or other components. The second back cover portion 418-2, when present, may be mounted to the first back cover portion 418-1 using fasteners, adhesives, seals, gaskets, or other components.

A display stack or device stack (hereinafter referred to as a "stack") including the display 412 may be attached (or abutted) to an interior surface of the front cover 416 and extend into an interior volume of the wearable device 400. In some cases, the stack may include a touch sensor (e.g., a grid of capacitive, resistive, strain based, ultrasonic, or other type of touch sensing elements), or other layers of optical, mechanical, electrical, or other types of components. In some cases, the touch sensor (or part of a touch sensor system) may be configured to detect a touch applied to an outer surface of the front cover 416 (e.g., to a display surface of the wearable device 400).

The wearable device 400 may include various sensors 422. For purposes of illustration, the wearable device 400 is shown having a first sensor 422-1 and a second sensor 422-2. The first sensor 422-1 may be an electromagnetic radiation detector as discussed herein, and may be used to sense various physical phenomena such as a proximity of the wearable device 400 to a user or biometric data about the user. The second sensor 422-2 may be a different type of sensor such as a temperature sensor, which may be used to sense the same or different data as the first sensor 422-1. The wearable device 400 may include circuitry 424 (e.g., processing circuitry and/or other components) configured to determine or extract, at least partly in response to signals received directly or indirectly from sensors therein (e.g., the first sensor 422-1 and the second sensor 422-2), data about the user (e.g., biometric data), a status of the wearable device 400, and/or data about the environment surrounding the wearable device 400. In doing so, the circuitry 424 may process signals from sensors therein using any suitable transformations, approximations, mathematical operations, and/or machine learning models. In some embodiments, the circuitry 424 may be configured to convey the determined or extracted parameters or statuses to a user of the wearable device 400. For example, the circuitry 424 may cause the indication or indications to be displayed on the display 412, indicated via audio or haptic outputs, transmitted via a wireless communications interface or other communications interface, and so on. The circuitry 424 may also or alternatively maintain or alter one or more settings, functions, or embodiments of the wearable device 400, including, in some cases, what is displayed on the display 412.

Figure 6:
FIG. 6 is an electrical block diagram illustrating a device, such as described herein.
Figure 6:
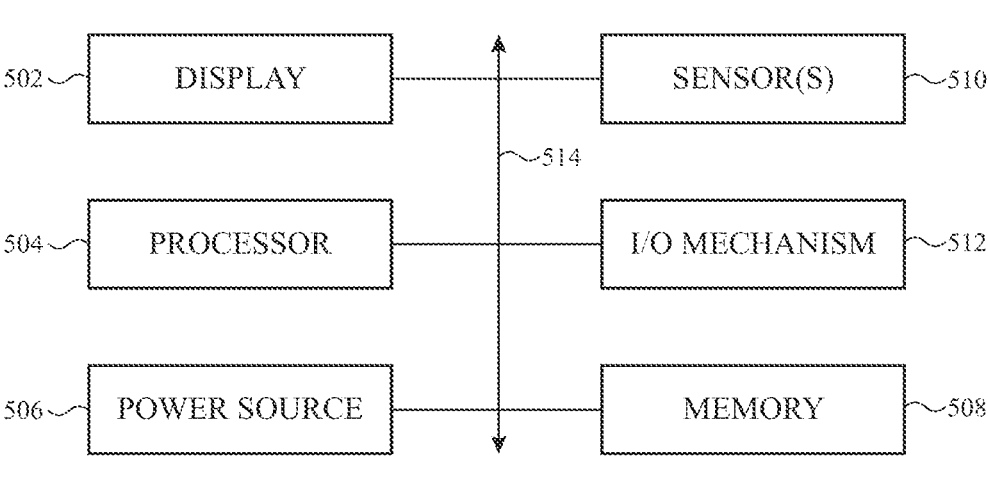

To illustrate a more general functional device that may include one or more electromagnetic radiation sensors as discussed herein, FIG. 6 shows a sample electrical block diagram of a device 500. The device 500 may include a display 502 (e.g., a light-emitting display), a processor 504, a power source 506, a memory 508, or storage device, a sensor system 510, and an input/output (I/O) mechanism 512 (e.g., an I/O device, an I/O port, or a haptic I/O interface). The processor 504 may communicate, either directly or indirectly, with some or all of the other components of the device 500. For example, a system bus or other communication mechanism 514 can provide communication between the display 502, the processor 504, the power source 506, the memory 508, the sensor system 510, and the I/O mechanism 512.

The processor 504 may be implemented as any electronic device capable of processing, receiving, or transmitting data or instructions, whether such data or instructions is in the form of software or firmware or otherwise encoded. For example, the processor 504 may include a microprocessor, central processing unit (CPU), an application-specific integrated circuit (ASIC), a digital signal processor (DSP), a controller, or a combination of such devices. As described herein, the term "processor" or "processing circuitry" is meant to encompass a single processing unit, multiple processors, multiple processing units, or other suitably configured computing element or elements.

It should be noted that the components of the device 500 can be controlled by multiple processors. For example, select components of the device 500 (e.g., the sensor system 510) may be controlled by a first processor and other components of the wearable device (e.g., the display 502) may be controlled by a second processor, where the first and second processors may or may not be in communication with each other.

The power source 506 can be implemented with any device capable of providing energy to the device 500. For example, the power source 506 may include one or more batteries or rechargeable batteries. Additionally or alternatively, the power source 506 may include a power connector or power cord that connects the device 500 to another power source, such as a wall outlet.

The memory 508 may store electronic data that can be used by the device 500. For example, the memory 508 may store electrical data or content such as, for example, audio and video files, documents and applications, device settings and user preferences, timing signals, control signals, and data structures and databases. The memory 508 may include any type of memory. By way of example only, the memory 508 may include random access memory (RAM), read-only memory (ROM), flash memory, removeable memory, other types of storage elements, or combinations of such memory types.

The device 500 may also include one or more sensor systems 510 positioned almost anywhere thereon. For example, the sensory system may include one or more electromagnetic radiation detectors as discussed in FIGS. 1 and 2. The sensor system 510 may be configured to sense one or more types of parameters, such as but not limited to: vibration, light, touch, force, heat, movement, relative motion, biometric data (e.g., biological parameters0 of a user, air quality, proximity, position, or connectedness. By way of example, the sensor system 510 may include one or more electromagnetic radiation detectors as discussed in FIGS. 1 and 2, a heat sensor, a position sensor, a light or optical sensor, an accelerometer, a pressure transducer, a gyroscope, a magnetometer, a health monitoring sensor, and/or an air quality sensor. Additionally, the one or more sensor system 510 may utilize any suitable sensing technology including, but not limited to, interferometric, magnetic, capacitive, ultrasonic, resistive, optical, acoustic, piezoelectric, or thermal technologies.

The I/O mechanism 512 may transmit or receive data from a user or another electronic device. The I/O mechanism 512 may include the display 502, a touch sensing input surface, a crown, one or more buttons (e.g., a graphical user interface "home" button), one or more cameras (including an under-display camera), one or more microphones or speakers, one or more ports such as a microphone port, and/or a keyboard. Additionally or alternatively, the I/O mechanism 512 may transmit electronic signals via a communications interface, such as a wireless, wired, and/or optical communications interface. Examples of wireless and wired communications interfaces include, but are not limited to, cellular and Wi-Fi communications interfaces.

These foregoing embodiments depicted in FIGS. 1-6 and the various alternatives thereof and variations thereto are presented, generally, for purposes of explanation, and to facilitate an understanding of various configurations and constructions of a system, such as described herein. However, it will be apparent to one skilled in the art that some of the specific details presented herein may not be required in order to practice a particular described embodiment, or an equivalent thereof.

Thus, it is understood that the foregoing and following descriptions of specific embodiments are presented for the limited purposes of illustration and description. These descriptions are not targeted to be exhaustive or to limit the disclosure to the precise forms recited herein. To the contrary, it will be apparent to one of ordinary skill in the art that many modifications and variations are possible in view of the above teachings.

As used herein, the phrase "at least one of" preceding a series of items, with the term "and" or "or" to separate any of the items, modifies the list as a whole, rather than each member of the list. The phrase "at least one of" does not require selection of at least one of each item listed; rather, the phrase allows a meaning that includes at a minimum one of any of the items, and/or at a minimum one of any combination of the items, and/or at a minimum one of each of the items. By way of example, the phrases "at least one of A, B, and C" or "at least one of A, B, or C" each refer to only A, only B, or only C; any combination of A, B, and C; and/or one or more of each of A, B, and C. Similarly, it may be appreciated that an order of elements presented for a conjunctive or disjunctive list provided herein should not be construed as limiting the disclosure to only that order provided.

One may appreciate that although many embodiments are disclosed above, that the operations and steps presented with respect to methods and techniques described herein are meant as exemplary and accordingly are not exhaustive. One may further appreciate that alternate step order or fewer or additional operations may be required or desired for particular embodiments.

Although the disclosure above is described in terms of various exemplary embodiments and implementations, it should be understood that the various features, aspects and functionality described in one or more of the individual embodiments are not limited in their applicability to the particular embodiment with which they are described, but instead can be applied, alone or in various combinations, to one or more of the some embodiments of the invention, whether or not such embodiments are described and whether or not such features are presented as being a part of a described embodiment. Thus, the breadth and scope of the present invention should not be limited by any of the above-described exemplary embodiments but is instead defined by the claims herein presented.

What is claimed is:

1. An electromagnetic radiation detector, comprising:
an electromagnetic radiation absorber layer comprising a first group III-V semiconductor material and having a first conductivity type;
an anode layer disposed on a first surface of the electromagnetic radiation absorber layer and having an anode contact disposed in contact with a surface of the anode layer:
a cathode layer disposed on a second surface of the electromagnetic radiation absorber layer, wherein:

the cathode layer comprises a second group III-V semiconductor material;

the cathode layer has a second conductivity type opposite the first conductivity type; and the cathode layer forms a PN junction with the electromagnetic radiation absorber layer, the PN junction being defined by in-situ doping of the cathode layer and in-situ doping of the electromagnetic radiation absorber layer; and one or more doped regions in the cathode layer, wherein:

the one or more doped regions have the first conductivity type and are defined by ex-situ doping of the cathode layer; and the one or more doped regions define a boundary of the PN junction between the cathode layer and the electromagnetic radiation absorber layer.

2. The electromagnetic radiation detector of claim 1, wherein the first conductivity type is p-type and the second conductivity type is n-type.

3. The electromagnetic radiation detector of claim 2, wherein:

the first surface of the electromagnetic radiation absorber layer is opposite the cathode layer; and the anode layer comprises a third group III-V semiconductor material and has the first conductivity type.

4. The electromagnetic radiation detector of claim 3, wherein the electromagnetic radiation absorber layer and the cathode layer form a mesa structure on the anode layer, the mesa structure defining a first surface disposed on the anode layer, a second surface opposite the first surface of the electromagnetic radiation absorber layer, and a sidewall between the first surface and the second surface.

5. The electromagnetic radiation detector of claim 4, wherein the one or more doped regions are provided along the sidewall of the mesa structure.

6. The electromagnetic radiation detector of claim 5, further comprising:

a cathode contact layer disposed on a portion of the cathode layer not including the one or more doped regions, the cathode contact layer having the second conductivity type; and a cathode contact disposed on the cathode contact layer.

7. The electromagnetic radiation detector of claim 6, wherein:

the anode layer comprises a first surface, a second surface opposite the first surface, the first surface of the mesa structure being disposed on the second surface of the anode layer, and a sidewall between the first surface and the second surface; and the anode contact is disposed on the second surface of anode layer between the sidewall of the anode layer and the sidewall of the mesa structure.

8. The electromagnetic radiation detector of claim 3, further comprising:

a cathode contact disposed on a portion of the cathode layer not including the one or more doped regions.

9. The electromagnetic radiation detector of claim 3, wherein:

the first group III-V semiconductor material comprises indium gallium arsenide (InGaAs);

the second group III-V semiconductor material comprises indium arsenide phosphide (InAsP); and the third group III-V semiconductor material comprises indium phosphide (InP).

10. A method for manufacturing an electromagnetic radiation detector, comprising:

providing an electromagnetic radiation absorber layer, the electromagnetic radiation absorber layer comprising a first group III-V semiconductor material and having a first conductivity type defined by an in-situ doping process;

providing an anode layer disposed on a first surface of the electromagnetic radiation absorber and having an anode contact disposed in contact with a surface of the anode layer;

providing a cathode layer disposed on a second surface of the electromagnetic radiation absorber layer, wherein:

the cathode layer comprises a second group III-V semiconductor material and has a second conductivity type defined by an in-situ doping process, the second conductivity type being opposite the first conductivity type; and the cathode layer forms a PN junction with the electromagnetic radiation absorber layer defined by in-situ doping of the cathode layer and in-situ doping of the electromagnetic radiation absorber layer; and providing one or more doped regions in the cathode layer via an ex-situ doping process, the one or more doped regions having the first conductivity type and defining a boundary of the PN junction between the cathode layer and the electromagnetic radiation absorber layer.

11. The method of claim 10 wherein the ex-situ doping process is a diffusion doping process.

12. The method of claim 10 wherein the ex-situ doping process is an ion implantation doping process.

13. The method of claim 10 wherein the first conductivity type is p-type and the second conductivity type is n-type.

14. The method of claim 13 further comprising the anode layer comprising a third group III-V semiconductor material and having the first conductivity type, wherein the electromagnetic radiation absorber layer is provided on the anode layer such that the electromagnetic radiation absorber layer is between the anode layer and the cathode layer.

15. The method of claim 14 further comprising patterning the cathode layer and the electromagnetic radiation absorber layer to provide a mesa structure on the anode layer, the mesa structure defining a first surface disposed on the anode layer, a second surface opposite the first surface of the mesa structure, and a sidewall between the first surface of the mesa structure and the second surface of the mesa structure.

16. The method of claim 15 wherein the one or more doped regions are provided along the sidewall of the mesa structure.

17. The method of claim 16, further comprising:

providing a cathode contact layer on a portion of the cathode layer not including the one or more doped regions, the cathode contact layer having the second conductivity type; and providing a cathode contact on the cathode contact layer.

18. The method of claim 17, wherein:

the anode layer comprises the first surface, a second surface opposite the first surface, the first surface of the mesa structure being disposed on the second surface of the anode layer, and a sidewall between the first surface and the second surface; and the method further comprises providing the anode contact on the second surface of the anode layer between the sidewall of the anode layer and the sidewall of the mesa structure.

19. The method of claim 14, further comprising:

providing a cathode contact on a portion of the cathode layer not including the one or more doped regions; and providing an anode contact on the anode layer.

20. The method of claim 14, wherein:

the first group III-V semiconductor material comprises indium gallium arsenide (InGaAs);

the second group III-V semiconductor material comprises indium arsenide phosphide (InAsP); and the third group III-V semiconductor material comprises indium phosphide (InP).

\*    \*    \*    \*    \*